(12) United States Patent
Slaton et al.

(10) Patent No.: US 12,381,305 B2
(45) Date of Patent: Aug. 5, 2025

(54) SWITCHABLE DIRECTIONAL COUPLER WITH INTERMEDIATE TERMINATION STATE

(71) Applicant: pSemi Corporation, San Diego, CA (US)

(72) Inventors: Joseph Slaton, San Diego, CA (US); Peter Bacon, Derry, NH (US)

(73) Assignee: PSEMI CORPORATION, San Diego, CA (US)

( * ) Notice: Subject to any disclaimer, the term of this patent is extended or adjusted under 35 U.S.C. 154(b) by 218 days.

(21) Appl. No.: 18/179,974

(22) Filed: Mar. 7, 2023

(65) Prior Publication Data

US 2024/0258676 A1 Aug. 1, 2024

Related U.S. Application Data

(63) Continuation-in-part of application No. 18/160,602, filed on Jan. 27, 2023, now abandoned.

(51) Int. Cl.
*H01P 5/18* (2006.01)
*H03H 7/38* (2006.01)

(52) U.S. Cl.
CPC ............... *H01P 5/18* (2013.01); *H03H 7/38* (2013.01)

(58) Field of Classification Search
CPC ................................ H01P 5/18; H03H 7/38
See application file for complete search history.

(56) References Cited

U.S. PATENT DOCUMENTS

2018/0048046 A1* 2/2018 Noguchi ................. H03H 7/48

* cited by examiner

*Primary Examiner* — Samuel S Outten
(74) *Attorney, Agent, or Firm* — Steinfl + Bruno LLP

(57) ABSTRACT

Quarter-wavelength switchable directional coupler architectures and methods that that use intermediate terminated states during directional mode-switching events to prevent generation of reflection coefficients that cause spur generation. A first embodiment of the invention utilizes existing circuitry within a quarter-wavelength switchable directional coupler but alters the conventional mode-switching sequence by adding new stage sequences to effectuate intermediate terminated states to mitigate or prevent spurs. A second embodiment of the invention modifies existing circuitry within a quarter-wavelength switchable directional coupler by adding a cross-coupled intermediate-stage termination circuit, and alters the conventional mode-switching sequence by adding new stage sequences to effectuate intermediate terminated states to mitigate or prevent spurs. A third embodiment of the invention also modifies existing circuitry within a quarter-wavelength switchable directional coupler by adding dual independent intermediate-stage termination circuits, and alters the conventional mode-switching sequence by adding new stage sequences to effectuate intermediate terminated states to mitigate or prevent spurs.

12 Claims, 9 Drawing Sheets

SWITCHABLE DIRECTIONAL COUPLER WITH INTERMEDIATE TERMINATION STATE

The present continuation-in-part application claims priority to the following patent application, assigned to the assignee of the present invention, the contents of which are incorporated by reference: U.S. patent application Ser. No. 18/160,602, filed Jan. 27, 2023, entitled "Switchable Directional Coupler with Intermediate Termination State".

BACKGROUND

(1) Technical Field

This invention relates to electronic circuits, and more particularly to directional coupler switches.

(2) Background

Many modern electronic systems include radio frequency (RF) transceivers; examples include personal computers, tablet computers, wireless network components, televisions, cable system "set top" boxes, radar systems, and cellular telephones. Many RF transceivers are quite complex two-way radios that transmit and receive RF signals. In some cases, RF transceivers are capable of transmitting and receiving across multiple frequencies in multiple bands; for instance, in the United States, the 2.4 GHz band is divided into 14 channels spaced about 5 MHz apart. As another example, a modern "smart telephone" may include RF transceiver circuitry capable of concurrently operating on different cellular communications systems (e.g., GSM and CDMA), on different wireless network frequencies and protocols (e.g., various IEEE 802.1 "WiFi" protocols at 2.4 GHz and 5 GHZ), and on "personal" area networks (e.g., Bluetooth based systems).

Common components of an RF transceiver are switchable directional couplers which may convey an RF signal from a power amplifier to an antenna when in a transmitting mode, and from an antenna to a low-noise amplifier (LNA) when in a receiving mode. A directional coupler is a passive electronic device that allows a defined amount of the power in an RF signal flowing from an input port to a direct port of a transmission line to be electromagnetically coupled to a coupled port, while blocking RF signal flow to an isolated or "terminated" port. A directional coupler may be implemented with two quarter-wavelength transmission lines in close enough proximity so that energy from one transmission line passes to the other transmission line via inductive and capacitive coupling. Such a directional coupler is symmetrical, in that the functions of the input port and direct port, and of the coupled port and terminated port, may be reversed.

For example, FIG. 1A is a schematic diagram of a prior art quarter-wavelength switchable (QWS) directional coupler 100 including a coupler structure 101 and a coupler switch 102. The coupler structure 101 includes a primary transmission line 103 in proximity to a generally parallel secondary transmission line 104. The primary transmission line 103 and secondary transmission line 104 are electromagnetically coupled, with a coupling factor of C. The QWS directional coupler 100 has three ports: P1, P2, and Ps, while the coupler structure 101 has four ports (two of which are common to the QWS directional coupler 100): P1, P2, P3, and P4.

Port P1 is the nominal forward-mode input port where RF power is applied, such as from a local power amplifier outputting an RF signal to an antenna. Port P1 becomes the reverse-mode direct port when the direction of the QWS directional coupler 100 is reversed, such as when a locally-received RF signal from an antenna is to be coupled to an LNA.

Port P2 is the nominal forward-mode direct port, where the power from the input port is provided, less the portion of the power sent to the coupled port P3. Port P2 becomes the reverse-mode input port when the direction of the QWS directional coupler 100 is reversed.

Port P3 is the nominal forward-mode coupled port where an electromagnetically-coupled portion of the RF power applied to the input port appears. The portion of the coupled power available at port P3 may be designed to be a fraction (e.g., 1% or 10%) of the RF power applied to the active input port. The portion of the input power coupled to port P3 depends on the coupling factor of a particular implementation of the primary transmission line 103 and the secondary transmission line 104. A 10 dB coupler splits the input power between the direct port and coupled port by about a 9:1 ratio (i.e., about 10% of the incident power is split off to the coupled port), and a 20 dB coupler splits the input power split between the direct port and coupled port by about a 99:1 ratio (i.e., about 1% of the incident power is split off to the coupled port). Port P3 becomes the reverse-mode terminated port when the direction of the QWS directional coupler 100 is reversed.

Port P4 is the nominal forward-mode terminated port where inductively coupled current and capacitively coupled power essentially cancel each other. Port P4 becomes the reverse-mode coupled port when the direction of the QWS directional coupler 100 is reversed.

By selectively altering termination circuits connected to the coupled port and the terminated port, the nominal input port can be switched to be the direct port, and vice versa. For example, in the illustrated example, a capacitor C1 is coupled between port P3 and a reference potential, such as circuit ground, and provides a matching load impedance. A termination circuit 106a is coupled in parallel with the capacitor C1 and includes a switch Sw1 coupled in series with a resistor R1, as illustrated. The capacitor C1 may be placed in parallel with resistor R1 by closing switch Sw1, thereby coupling a termination impedance to port P3 that is different from the matching load impedance provided by capacitor C1 alone. Similarly, a capacitor C2 is coupled between port P4 and the reference potential, and provides a matching load impedance. A termination circuit 106b is coupled in parallel with the capacitor C2 and includes a switch Sw2 coupled in series with a resistor R2, as illustrated. The capacitor C2 may be placed in parallel with resistor R2 by closing switch Sw2, thereby coupling a termination impedance to port P4 that is different from the matching load impedance provided by capacitor C2 alone. Note that while capacitors C1 and C2 are used in the specific illustrated embodiment as matching load impedances, matching load impedances may be implemented using components with a wide range of real plus imaginary impedance values, depending upon design and operational specifics (e.g., a specified frequency range).

Ports P3 and P4 may be selectively coupled by respective switches Sw3 and Sw4 to a sampling or output port $P_s$. In the illustrated example, an optional electro-static discharge (ESD) protection switch $Sw_{SH}$ is coupled between the sampling port $P_s$ and a reference potential; when closed, switch $Sw_{SH}$ protects against ESD events.

As is known in the art, a controller (not shown) regulates the sequence of switch openings and closings to effect directional mode-switching events. The switches Sw1-Sw4 may be implemented as FET devices, particularly MOSFET devices.

Closing switch Sw2 to bypass capacitor C2 and switch Sw3 to couple port P3 to port $P_s$, while opening switches Sw1 and Sw4, places the QWS directional coupler 100 in a forward (FWD) mode of operation. When switches Sw1 and Sw4 are open and switches Sw2 and Sw3 are closed, capacitor C1 functions as a matching load impedance to match the impedances of ports $P_s$ and P3, while resistor R2 plus the ON resistance of switch Sw2 in parallel with capacitor C2 provides a good termination impedance for port P4. In the FWD mode, RF power applied at port P1 is conveyed to port P2, with a fraction of that power being coupled through port P3 to the sampling port $P_s$. The FWD mode may be dedicated, for example, to conveying RF power from a power amplifier coupled to port P1 to an antenna coupled to port P2 while coupling a portion of that RF power to port $P_s$.

Conversely, closing switch Sw1 to bypass capacitor C1 and switch Sw4 to couple port P4 to port $P_s$, while opening switches Sw2 and Sw3, places the QWS directional coupler 100 in a reverse (REV) mode of operation. When switches Sw2 and Sw3 are open and switches Sw1 and Sw4 are closed, capacitor C2 functions as a matching load impedance to match the impedances of ports $P_s$ and P4, while resistor R1 plus the ON resistance of switch Sw1 in parallel with capacitor C1 provides a good termination impedance for port P3. In the REV mode, RF power applied at port P2 is conveyed to port P1, with a fraction of that power being coupled through port P4 to the sampling port $P_s$. The REV mode may be dedicated, for example, to conveying RF power from an antenna coupled to port P2 to an LNA coupled to port P1 while coupling a portion of the RF power to port $P_s$.

The RF signal available at the sampling port $P_s$ may be used, for example, for measurement or monitoring (e.g., for power, Voltage Standing Wave Ratio, etc.), and for feedback in general. As an example of one application, directional coupler switches 100 are a key element in cellular telephone modules, being used to support, for instance, antenna tuning, dynamic impedance matching, and power control.

An important aspect in designing RF transceivers is to minimize unwanted transient signals "spurs") that may affect either transmission or reception of RF signals, where "spurs" includes (but is not limited to) discrete spurs and/or integrated spurious power. In RF QWS directional couplers 100, spurs may be generated when changing termination states on ports P3 and P4 (i.e., the coupled and terminated ports) due to large reflection coefficients, which can cause performance issues in the RF front end (RFFE) of a transceiver.

For example, TABLE 1 shows a sequence of switch states for switches Sw1-Sw4 of FIG. 1A and the corresponding impedances $Z_{P3}$ and $Z_{P4}$ (in ohms) seen at port P3 and port P4 respectively. The sequence progresses in stages from a FWD mode to a REV mode and then back to a FWD mode. Thus, at Stage 1, the QWS directional coupler 100 is in the FWD mode, the port P3 impedance is approximately 50 ohms, and the port P4 impedance is the resistance of resistor R2 plus the ON resistance of switch Sw2 (50 ohms is a common characteristic impedance for RF component or circuit interconnections). At Stage 2, switches Sw2 and Sw3 are set to an OFF state (thus all switches are open), resulting in high impedances seen at both ports P3 and P4 (e.g., greater than about 100 ohms, but 100 ohms or so is where the mismatch loss will likely begin to impact the coupler behavior). At Stage 3, switches Sw1 and Sw4 are set to an ON state (and are thus closed), completing the FWD-to-REV mode transition. In the REV mode, the port P3 impedance is the resistance of resistor R1 plus the ON resistance of switch Sw1 and the port P4 impedance is approximately 50 ohms. The REV-to-FWD mode transition essentially reverses the Stage 1-3 switching sequences, resulting in high impedances seen at both ports P3 and P4 during Stage 4.

TABLE 1

| Stage n | $Z_{P3}$ | $Z_{P4}$ | Sw1 | Sw2 | Sw3 | Sw4 |
|---|---|---|---|---|---|---|
| 1 (FWD) | 50 | R2 | OFF | ON | ON | OFF |
| 2 | High | High | OFF | OFF | OFF | OFF |
| 3 (REV) | R1 | 50 | ON | OFF | OFF | ON |
| 4 | High | High | OFF | OFF | OFF | OFF |
| 5 (FWD) | 50 | R2 | OFF | ON | ON | OFF |

In cellular RFFEs, transmitting and/or receiving while switching between FWD and REV modes can cause spurs to be generated because of the high impedances seen at ports P3 and P4 during Stages 2 and 4, which lead to large reflection coefficients. For example, FIG. 1B is a graph 110 of power (in dBm) versus time (in μS) for an RF signal propagating through a modeled QWS directional coupler 100 of the type shown in FIG. 1A. During transitions from FWD mode to REV mode and back, spurs 112 are generated which allow RF energy to leak back into a transceiver, where, for example, the spur RF energy may be amplified by an LNA, a generally undesirable condition. Further, the level of spurious signals rises above the minimum received signal level, which may cause the receiver to be effectively jammed.

Accordingly, there is a need for a switchable directional coupler architecture or method that suppresses reflection related spurs. The present invention provides for such an architecture and provides additional benefits.

SUMMARY

The present invention encompasses quarter-wavelength switchable (QWS) directional coupler architectures and methods that use intermediate terminated states during directional mode-switching events to prevent generation of reflection coefficients that cause spurs. The basic concept employed by embodiments of the present invention is to always couple a significant impedance to the coupled and terminated ports of the coupler structure of a QWS directional coupler during switch-state transitions of a coupler switch.

A first embodiment of the invention utilizes existing circuitry within a QWS directional coupler but alters the conventional mode-switching sequence by adding new stage sequences to effectuate intermediate terminated states to mitigate or prevent spurs.

A second embodiment of the invention modifies existing circuitry within a QWS directional coupler by adding a cross-coupled intermediate-stage termination circuit, and alters the conventional mode-switching sequence by adding new stage sequences to effectuate intermediate terminated states to mitigate or prevent spurs.

A third embodiment of the invention also modifies existing circuitry within a QWS directional coupler by adding dual independent intermediate-stage termination circuits, and alters the conventional mode-switching sequence by adding new stage sequences to effectuate intermediate terminated states to mitigate or prevent spurs.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses QWS directional coupler architectures and methods that use intermediate terminated states during directional mode-switching events to prevent generation of reflection coefficients that cause spurs. The basic concept employed by embodiments of the present invention is to always couple a significant impedance to the coupled and terminated ports of the coupler structure of a QWS directional coupler during switch-state transitions of a coupler switch.

Intermediate Termination with Existing Devices

A first embodiment of the invention utilizes existing circuitry within a QWS directional coupler but alters the conventional mode-switching sequence, depicted in TABLE 1 above, by adding new stage sequences to effectuate intermediate terminated states to mitigate or prevent spurs. In essence, the switches Sw1, Sw2 in the termination circuits 106a, 106b of FIG. 1A are switched in a pattern that ensures that they are not both OFF (open) at the same time.

Figure 1A:
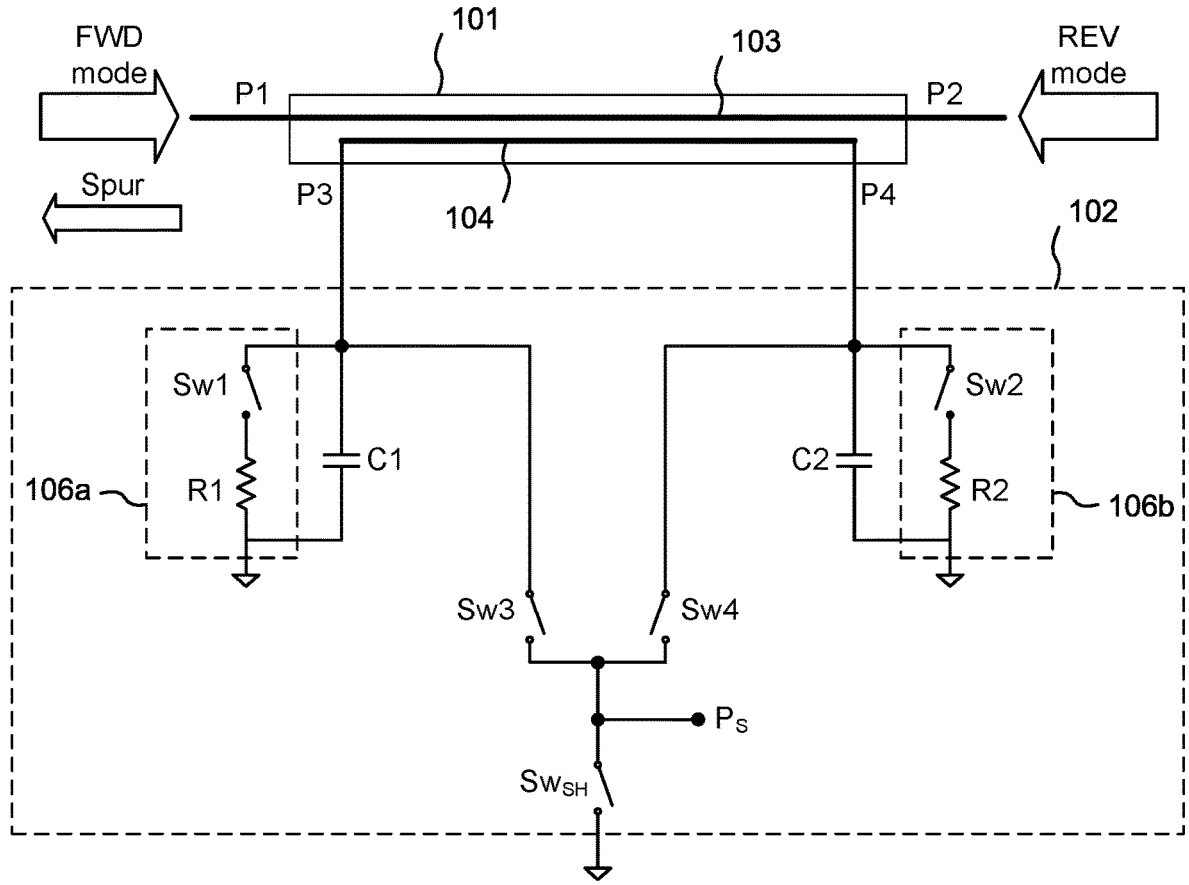
FIG. 1A is a schematic diagram of a prior art QWS directional coupler comprising a primary transmission line in proximity to a parallel secondary transmission line.
Figure 1B:
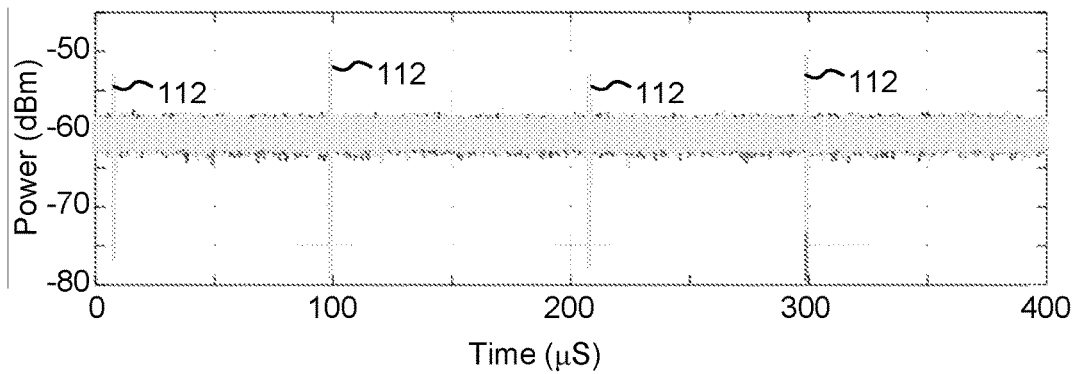
FIG. 1B is a graph of power (in dBm) versus time (in uS) for an RF signal propagating through a modeled QWS directional coupler of the type shown in FIG. 1A.

For example, TABLE 2 shows a novel sequence of switch states for switches Sw1-Sw4 of FIG. 1A and the corresponding impedances $Z_{P3}$ and $Z_{P4}$ (in ohms) seen at port P3 and port P4 respectively. Importantly, both termination switches Sw1 and Sw2 are closed (ON) before and while the through switches Sw3 and Sw4 are toggled.

TABLE 2

| Stage n | $Z_{P3}$ | $Z_{P4}$ | Sw1 | Sw2 | Sw3 | Sw4 |
| --- | --- | --- | --- | --- | --- | --- |
| 1 (FWD) | 50 | R2 | OFF | ON | ON | OFF |
| 2 | R2* | R2 | ON | ON | ON | OFF |
| 3 | R1‖R2* | R2‖50 | ON | ON | OFF | ON |
| 4 (REV) | R1 | 50 | ON | OFF | OFF | ON |
| 5 | R1 | R1* | ON | ON | OFF | ON |
| 6 | R1‖50 | R2‖R1* | ON | ON | ON | OFF |
| 7 (FWD) | 50 | R2 | OFF | ON | ON | OFF |

*Impedance as seen through secondary transmission line 104 coupling

Figure 2:
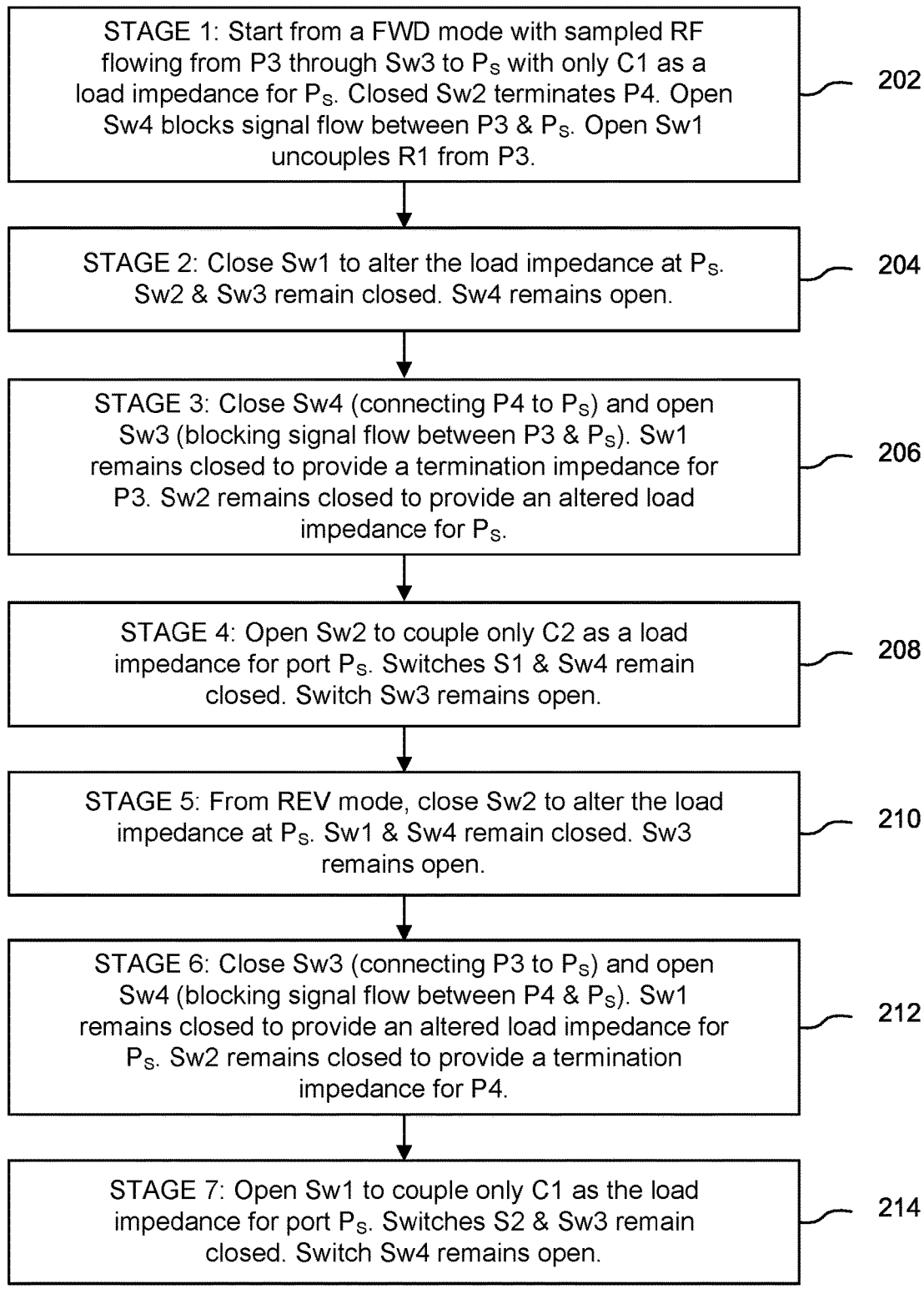
FIG. 2 is a process flow chart describing the sequence of switch changes shown in TABLE 2.

FIG. 2 is a process flow chart 200 describing the sequence of switch changes shown in TABLE 2. Stage 1 [Block 202] starts from a FWD mode with sampled RF energy flowing from port P3 through switch Sw3 to port $P_s$, with just capacitor C1 providing a load impedance for port $P_s$. Switch Sw2 is closed to provide a termination impedance (resistor R2 plus the ON resistance of switch Sw2 in parallel with capacitor C2) for port P4. Open switch Sw4 blocks signal flow between port P4 and port $P_s$, and open switch Sw1 uncouples termination resistor R1 from port P3.

At Stage 2 [Block 204], switch Sw1 is closed to connect termination resistor R1 in parallel with capacitor C1, thus altering the load impedance seen by port $P_s$. Switches Sw2 and Sw3 remain closed, and switch Sw4 remains open.

At Stage 3 [Block 206], switch Sw4 is closed, thus connecting port P4 to port $P_s$, and switch Sw3 is opened, thus blocking signal flow between port P3 and port $P_s$. Switch Sw1 remains closed to provide a termination impedance (resistor R1 plus the ON resistance of switch Sw1 in parallel with capacitor C1) for port P3. Switch Sw2 remains closed to provide an altered load impedance for port $P_s$.

In the final stage from the FWD mode to the REV mode, at Stage 4 [Block 208], switch Sw2 is opened to couple just capacitor C2 as the load impedance for port $P_s$. Switch S1 remains closed to provide a termination impedance for port P3. Switch Sw3 remains open and switch Sw4 remains closed.

For transitions from the REV mode to the FWD mode, in Stage 5 [Block 210], switch Sw2 is closed to connect termination resistor R2 in parallel with capacitor C2, thus altering the load impedance seen by port Ps. Switches Sw1 and Sw4 remain closed, and switch Sw3 remains open.

At Stage 6 [Block 212], Sw3 is closed, thus connecting port P3 to port $P_s$, and Sw4 is opened, thus blocking signal flow between port P4 and port $P_s$. Switch Sw1 remains closed to provide an altered load impedance for port $P_s$. Switch Sw2 remains closed to provide a termination impedance for port P4.

In the final stage from the REV mode to the FWD mode, at Stage 7 [Block 214], switch Sw1 is opened to couple just capacitor C1 as the load impedance for port $P_s$. Switch S2 remains closed to provide a termination impedance for port P4. Switch Sw3 remains closed and switch Sw4 remains open.

As the values of $Z_{P3}$ and $Z_{P4}$ in TABLE 2 show, no intermediate stage of the directional mode-switching sequences from the FWD mode to the REV mode, or vice versa, results in either port P3 or port P4 seeing a high impedance—no impedance value exceeds the higher value of resistors R1 and R2. As a consequence, the high-impedance stages of the prior art that generate reflection-related spurs are essentially eliminated at common values for R1 and R2.

It should be appreciated that the sequence of stages in TABLE 2 can be achieved through an alteration of a switch control sequence from a conventional controller, yet results in substantial mitigation, and in some applications complete prevention, of reflection-related spurs.

Cross-Coupled Intermediate-Stage Termination Circuit

A second embodiment of the invention modifies existing circuitry within a QWS directional coupler and alters the conventional mode-switching sequence depicted in TABLE 1 above by adding new stage sequences to effectuate intermediate terminated states to mitigate or prevent spurs.

Figure 3A:
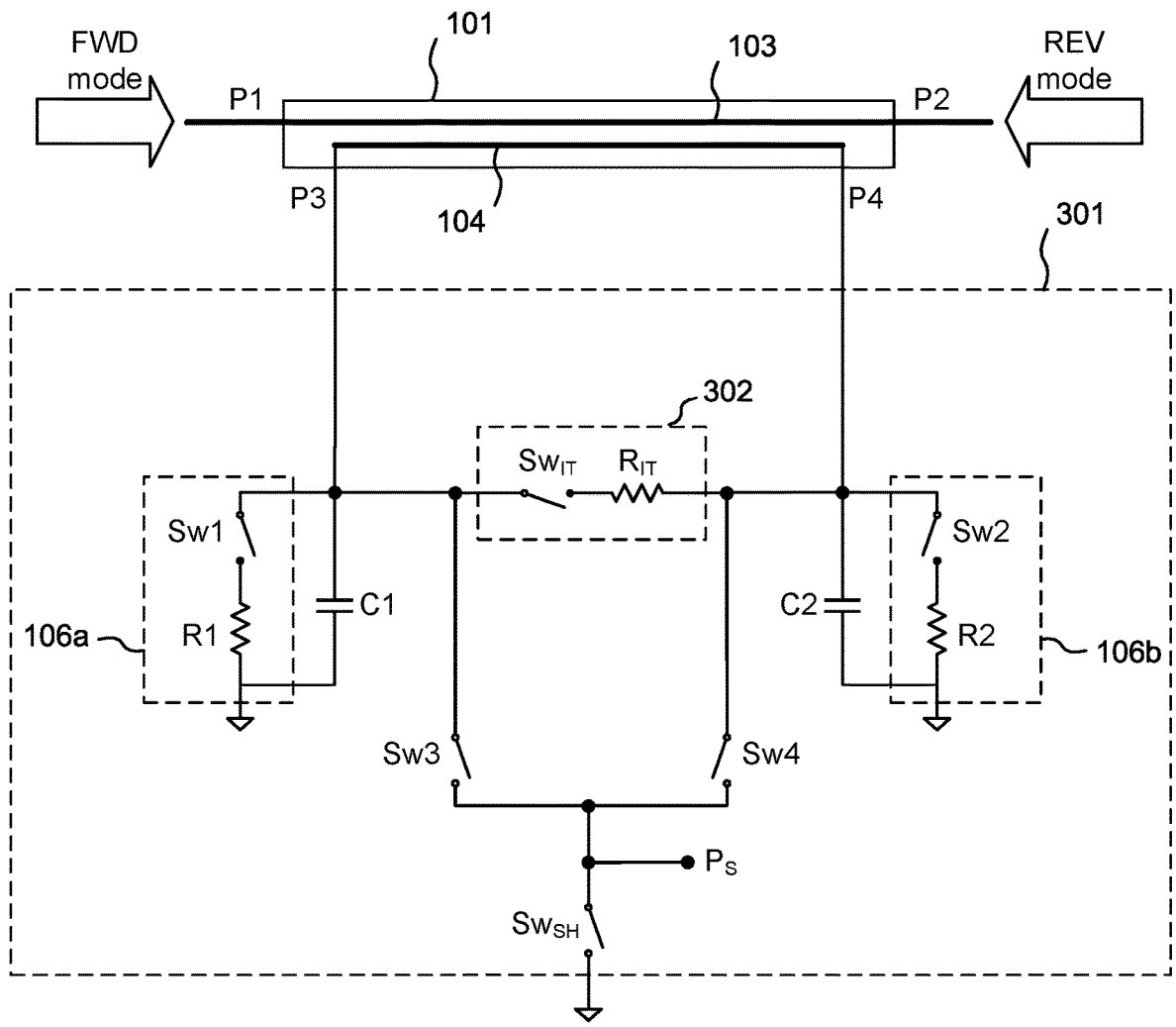
FIG. 3A is a schematic diagram of a QWS directional coupler having a modified coupler switch 301 that includes a cross-coupled intermediate-stage termination circuit.

FIG. 3A is a schematic diagram of a QWS directional coupler 300 having a modified coupler switch 301 that includes a cross-coupled intermediate-stage termination circuit 302. The cross-coupled intermediate-stage termination circuit 302 is coupled between port P3 and port P4 and includes a switch $Sw_{IT}$ coupled in series with a resistor $R_{IT}$, as illustrated. An altered switch control sequence from a conventional controller results in substantial mitigation, and in some applications complete prevention, of reflection-related spurs. The switch $Sw_{IT}$ may be implemented as a FET device, particularly a MOSFET device.

TABLE 3 shows a novel sequence of switch states for switches Sw1-Sw4 and $Sw_{IT}$ of FIG. 3 and the corresponding impedances $Z_{P3}$ and $Z_{P4}$ (in ohms) seen at port P3 and port P4 respectively. Of note, switch $Sw_{IT}$ is the only switch changing states between Stages 1 and 2, between Stages 4 and 5, between Stages 5 and 6, and between stages 8 and 9.

TABLE 3

| Stage n | $Z_{P3}$ | $Z_{P4}$ | Sw1 | Sw2 | Sw3 | Sw4 | $Sw_{IT}$ |
|---|---|---|---|---|---|---|---|
| 1 (FWD) | 50 | $R_2$ | OFF | ON | ON | OFF | OFF |
| 2 | $50\|R_{IT}$ | $R_2\|R_{IT}$ | OFF | ON | ON | OFF | ON |
| 3 | $R_{IT}$ | $R_{IT}$ | OFF | OFF | OFF | OFF | ON |
| 4 | $R_1\|R_{IT}$ | $50\|R_{IT}$ | ON | OFF | OFF | ON | ON |
| 5 (REV) | $R_1$ | 50 | ON | OFF | OFF | ON | OFF |
| 6 | $R_1\|R_{IT}$ | $50\|R_{IT}$ | ON | OFF | OFF | ON | ON |
| 7 | $R_{IT}$ | $R_{IT}$ | OFF | OFF | OFF | OFF | ON |
| 8 | $50\|R_{IT}$ | $R_2\|R_{IT}$ | OFF | ON | ON | OFF | ON |
| 9 (FWD) | 50 | $R_2$ | OFF | ON | ON | OFF | OFF |

Figure 3B:
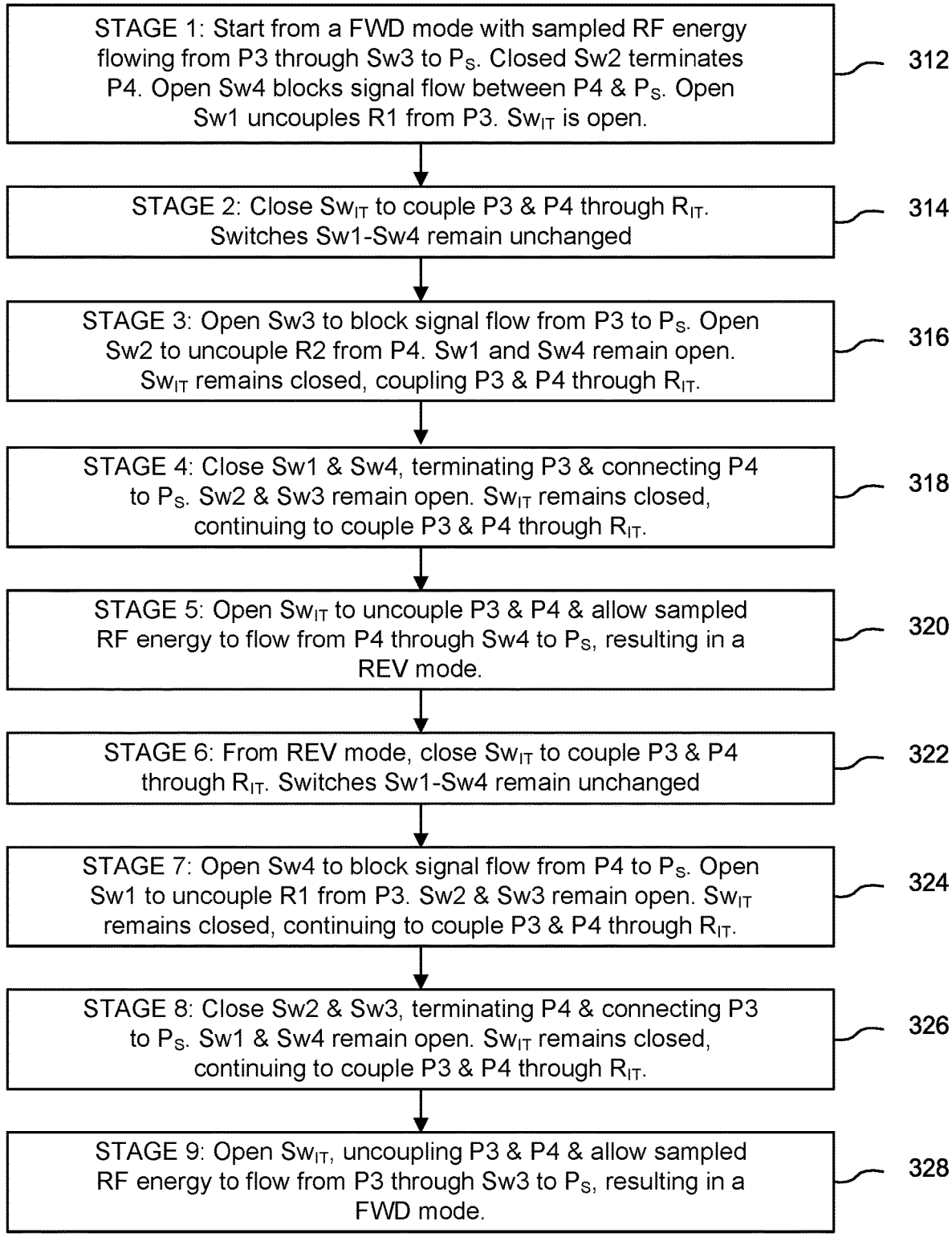
FIG. 3B is a process flow chart describing the sequence of switch changes shown in TABLE 3.

FIG. 3B is a process flow chart 310 describing the sequence of switch changes shown in TABLE 3.

Stage 1 [Block 312] starts from a FWD mode with sampled RF energy flowing from port P3 through switch Sw3 to port $P_s$. Closed Switch Sw2 provides a termination impedance (resistor R2 plus the ON resistance of switch Sw2 in parallel with capacitor C2) for port P4. Open switch Sw4 blocks signal flow between port P4 and port $P_s$, and open switch Sw1 uncouples termination resistor R1 from port P3. Switch $Sw_{IT}$ is open and thus ports P3 and P4 are not coupled through resistor $R_{IT}$.

At Stage 2 [Block 314], switches Sw1-Sw4 remain unchanged. Switch $Sw_{IT}$ is closed, thus coupling ports P3 and P4 through resistor $R_{IT}$. As a result, each of ports P3 and P4 see an impedance equal to the value of $R_{IT}$ (rather than a high impedance, as in a conventional design)

At Stage 3 [Block 316], switches Sw2 and Sw3 are opened. Opened switch Sw3 blocks signal flow from port P3 to port $P_s$. Opened switch Sw2 uncouples resistor R2 from port P4. Switches Sw1 and Sw4 remain open. Switch $Sw_{IT}$ remains closed.

At Stage 4 [Block 318], switches Sw1 and Sw4 are closed, thus terminating port P3 and connecting port P4 to port $P_s$. Switches Sw2 and Sw3 remain open. Switch $Sw_{IT}$ remains closed, thus continuing to couple ports P3 and P4 through resistor $R_{IT}$. As a result, each of ports P3 and P4 see relatively low impedance values.

In the final stage from the FWD mode to the REV mode, at Stage 5 [Block 320], switch $Sw_{IT}$ is opened, thus uncoupling ports P3 and P4. Accordingly, sampled RF energy may flow from port P4 through switch Sw4 to port $P_s$.

For transitions from the REV mode to the FWD mode, in Stage 6 [Block 322], switch $Sw_{IT}$ is closed, thus coupling ports P3 and P4 through resistor $R_{IT}$. Switches Sw1-Sw4 remain unchanged.

At Stage 7 [Block 324], switches Sw1 and Sw4 are opened. Opened switch Sw4 blocks signal flow from port P4 to port $P_s$. Opened switch Sw1 uncouples resistor R1 from port P3. Switches Sw2 and Sw3 remain open. Switch $Sw_{IT}$ remains closed; as a result, each of ports P3 and P4 see an impedance equal to the value of $R_{IT}$ (rather than a high impedance, as in a conventional design).

At Stage 8 [Block 326], switches Sw2 and Sw3 are closed, thus terminating port P4 and connecting port P3 to port $P_s$. Switches Sw1 and Sw4 remain open. Switch $Sw_{IT}$ remains closed, continuing to couple ports P3 and P4 through resistor $R_{IT}$. As a result, each of ports P3 and P4 see relatively low impedance values.

In the final stage from the REV mode to the FWD mode, at Stage 9 [Block 328], switch $Sw_{IT}$ is opened, thus uncoupling ports P3 and P4. Accordingly, sampled RF energy may flow from port P3 through switch Sw3 to port $P_s$.

As the values of $Z_{P3}$ and $Z_{P4}$ in TABLE 2 show, no intermediate stage of the directional mode-switching sequences from the FWD mode to the REV mode, or vice versa, results in either port P3 or port P4 seeing a high impedance—no impedance value exceeds the highest value of $R_{IT}$, $R_{IT}$ in parallel with R1, or $R_{IT}$ in parallel with R2. As a consequence, the high-impedance stages of the prior art that generate reflection-related spurs are essentially eliminated at common values for R1 and R2 (the value of $R_{IT}$ can be selected by a designer specifically for intermediate termination purposes).

An advantage of the embodiment shown in FIG. 3A is that the values of resistors R1 and R2 may be selected to optimize tuning of the QWS directional coupler 300 for particular applications, while the value of the intermediate termination resistor $R_{IT}$ in the cross-coupled intermediate-stage termination circuit 302 may be selected to better optimize the impedances $Z_{P3}$ and $Z_{P4}$ during mode-switching.

Dual Independent Intermediate-Stage Termination Circuits

A third embodiment of the invention also modifies existing circuitry within a QWS directional coupler and alters the conventional mode-switching sequence depicted in TABLE 1 above by adding new stage sequences to effectuate intermediate terminated states to mitigate or prevent spurs.

Figure 4A:
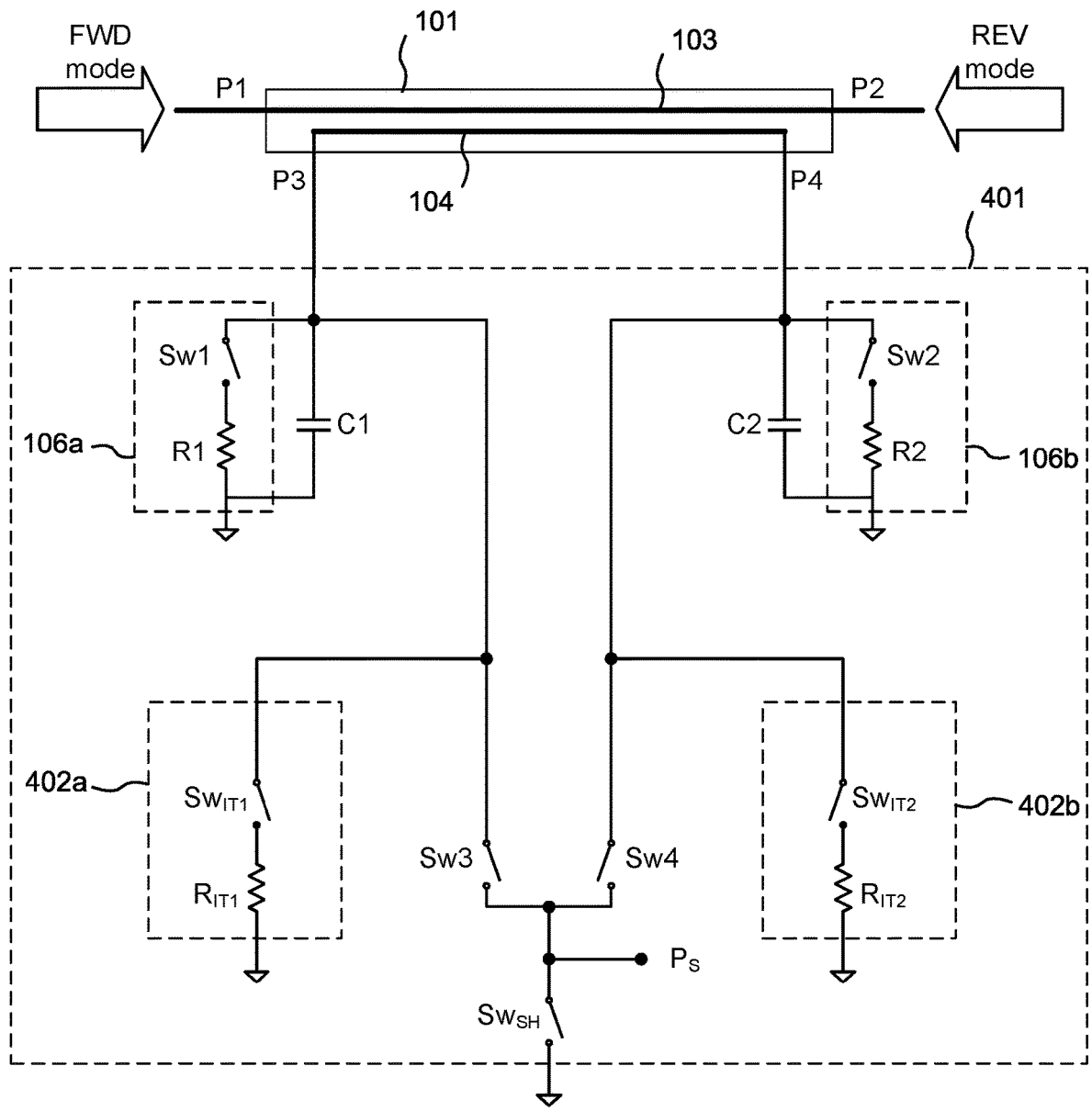
FIG. 4A is a schematic diagram of a QWS directional coupler having a modified coupler switch that includes dual independent intermediate-stage termination circuits.

FIG. 4A is a schematic diagram of a QWS directional coupler 400 having a modified coupler switch 401 that includes dual independent intermediate-stage termination circuits 402a and 402b. Independent intermediate-stage termination circuit 402a is coupled between port P3 and a reference potential, such as circuit ground. Independent intermediate-stage termination circuit 402a includes a switch $Sw_{IT}$ coupled in series with a resistor $R_{IT1}$, as illustrated. Similarly, independent intermediate-stage termination circuit 402b is coupled between port P4 and the reference potential, and includes a switch $SW_{IT2}$ coupled in series with a resistor $R_{IT2}$, as illustrated. The switches $Sw_{IT}$ and $SW_{IT2}$ may be implemented as FET devices, particularly MOSFET devices. An altered switch control sequence from a conventional controller results in substantial mitigation, and in some applications complete prevention, of reflection-related spurs.

TABLE 4 shows a novel sequence of switch states for switches Sw1-Sw4, $SW_{IT1}$, and $SW_{IT2}$ of FIG. 4A and the corresponding impedances $Z_{P3}$ and $Z_{P4}$ (in ohms) seen at port P3 and port P4 respectively. Of note, switches $Sw_{IT1}$ and $Sw_{It2}$ are the only switches changing states between Stages 1 and 2, between Stages 4 and 5, between Stages 5 and 6, and between Stages 8 and 9.

TABLE 4

| Stage n | $Z_{P3}$ | $Z_{P4}$ | Sw1 | Sw2 | Sw3 | Sw4 | $Sw_{IT1}$ | $Sw_{IT2}$ |
|---|---|---|---|---|---|---|---|---|
| 1 (FWD) | 50 | $R_2$ | OFF | ON | ON | OFF | OFF | OFF |
| 2 | $50\|R_{IT1}$ | $R_2\|R_{IT2}$ | OFF | ON | ON | OFF | ON | ON |
| 3 | $R_{IT1}$ | $R_{IT2}$ | OFF | OFF | OFF | OFF | ON | ON |
| 4 | $R_1\|R_{ITT}$ | $50\|R_{IT2}$ | ON | OFF | OFF | ON | ON | ON |
| 5 (REV) | $R_1$ | 50 | ON | OFF | OFF | ON | OFF | OFF |
| 6 | $R_1\|R_{IT1}$ | $50\|R_{IT2}$ | ON | OFF | OFF | ON | ON | ON |
| 7 | $R_{IT1}$ | $R_{IT2}$ | OFF | OFF | OFF | OFF | ON | ON |
| 8 | $50\|R_{ITT}$ | $R_2\|R_{IT2}$ | OFF | ON | ON | OFF | ON | ON |
| 9 (FWD) | 50 | $R_2$ | OFF | ON | ON | OFF | OFF | OFF |

Figure 4B:
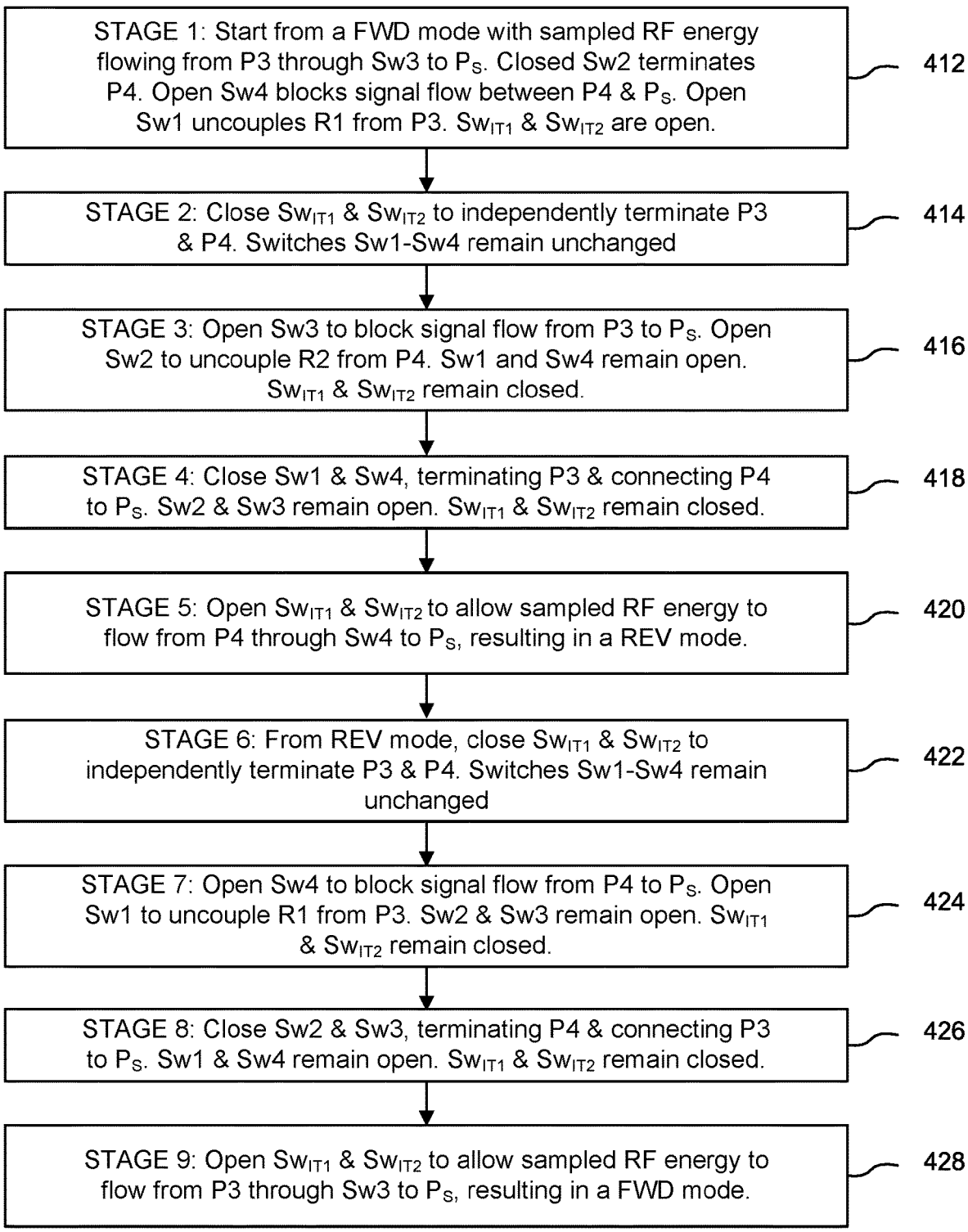
FIG. 4B is a process flow chart describing the sequence of switch changes shown in TABLE 4.

FIG. 4B is a process flow chart 410 describing the sequence of switch changes shown in TABLE 4.

Stage 1 [Block 412] starts from a FWD mode with sampled RF energy flowing from port P3 through switch Sw3 to port $P_s$. Closed Switch Sw2 provides a termination impedance (resistor R2 plus the ON resistance of switch Sw2 in parallel with capacitor C2) for port P4. Open switch Sw4 blocks signal flow between port P3 and port $P_s$, and open switch Sw1 uncouples termination resistor R1 from port P3. Switches $Sw_{IT1}$ and $SW_{IT2}$ are open and thus ports P3 and P4 are not terminated through respective resistors $R_{IT1}$ and $R_{IT2}$.

At Stage 2 [Block 414], switches Sw1-Sw4 remain unchanged. Switches $Sw_{IT1}$ and $SW_{IT2}$ are closed, thus independently terminating ports P3 and P4 through respective resistors $R_{IT1}$ and $R_{IT2}$. As a result, ports P3 and P4 see an impedance equal to the respective value of $R_{IT1}$ or $R_{IT2}$ (rather than a high impedance, as in a conventional design).

At Stage 3 [Block 416], switches Sw2 and Sw3 are opened. Opened switch Sw3 blocks signal flow between port P3 and port $P_s$. Opened switch Sw2 uncouples resistor R2 from port P4. Switches Sw1 and Sw4 remain open. Switches $Sw_{IT1}$ and $SW_{IT2}$ remain closed, thus continuing to terminate ports P3 and P4. As a result, ports P3 and P4 continue to see relatively low impedance values.

At Stage 4 [Block 418], switches Sw1 and Sw4 are closed, thus terminating port P3 and connecting port P4 to port $P_s$. Switches Sw2 and Sw3 remain open. Switches $Sw_{IT1}$ and $SW_{IT2}$ remain closed, thus continuing to terminate ports P3 and P4. As a result, ports P3 and P4 continue to see relatively low impedance values.

In the final stage from the FWD mode to the REV mode, at Stage 5 [Block 420], switches $Sw_{IT1}$ and $SW_{IT2}$ are opened, thus uncoupling ports P3 and P4 from the reference potential. Accordingly, sampled RF energy may flow from port P4 through switch Sw4 to port $P_s$.

For transitions from the REV mode to the FWD mode, in Stage 6 [Block 422], switches $SW_{IT1}$ and $SW_{IT2}$ are closed, thus independently terminating ports P3 and P4 through respective resistors $R_{IT1}$ and $R_{IT2}$. As a result, ports P3 and P4 see an impedance equal to the respective value of $R_{IT1}$ or $R_{IT2}$ (rather than a high impedance, as in a conventional design). Switches Sw1-Sw4 remain unchanged.

At Stage 7 [Block 424], switches Sw1 and Sw4 are opened. Opened switch Sw4 blocks signal flow from port P4 to port $P_s$. Opened switch Sw1 uncouples resistor R1 from port P3. Switches Sw2 and Sw3 remain open. Switches $Sw_{IT1}$ and $SW_{IT2}$ remain closed, thus continuing to terminate ports P3 and P4. As a result, ports P3 and P4 continue to see relatively low impedance values.

At Stage 8 [Block 426], switches Sw2 and Sw3 are closed, thus terminating port P4 and connecting port P3 to port $P_s$. Switches Sw1 and Sw4 remain open. Switches $Sw_{IT1}$ and $SW_{IT2}$ remain closed, thus continuing to terminate ports P3 and P4. As a result, ports P3 and P4 continue to see relatively low impedance values.

In the final stage from the REV mode to the FWD mode, at Stage 9 [Block 428], switches $Sw_{IT1}$ and $Sw_{IT2}$ are opened, thus uncoupling ports P3 and P4 from the reference potential. Accordingly, sampled RF energy may flow from port P3 through switch Sw3 to port $P_s$.

An advantage of the embodiment shown in FIG. 4A is that the values of $Z_{P3}$ and $Z_{P4}$ during transition stages between the FWD and REV modes (i.e., not including the end stages when in the FWD or REV mode) are totally independent of the values of R1 and R2, and depend only on the values of the intermediate termination resistors $R_{IT1}$ and $R_{IT2}$. Accordingly, the values of R1 and R2 may be selected to optimize tuning of the QWS directional coupler 400 for particular applications, while the values of the intermediate termination resistors $R_{IT1}$ and $R_{IT2}$ in the independent intermediate-stage termination circuits 402a and 402b may be selected to optimize the impedances $Z_{P3}$ and $Z_{P4}$ during mode-switching.

As the values of $Z_{P3}$ and $Z_{P4}$ in TABLE 4 show, no intermediate stage of the directional mode-switching sequences from the FWD mode to the REV mode, or vice versa, results in either port P3 or port P4 seeing a high impedance—no impedance value exceeds the higher value of resistors $R_{IT1}$ or $R_{IT2}$. As a consequence, the high-impedance stages of the prior art that generate reflection-related spurs are essentially eliminated.

Circuit Embodiments

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end-product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 5:
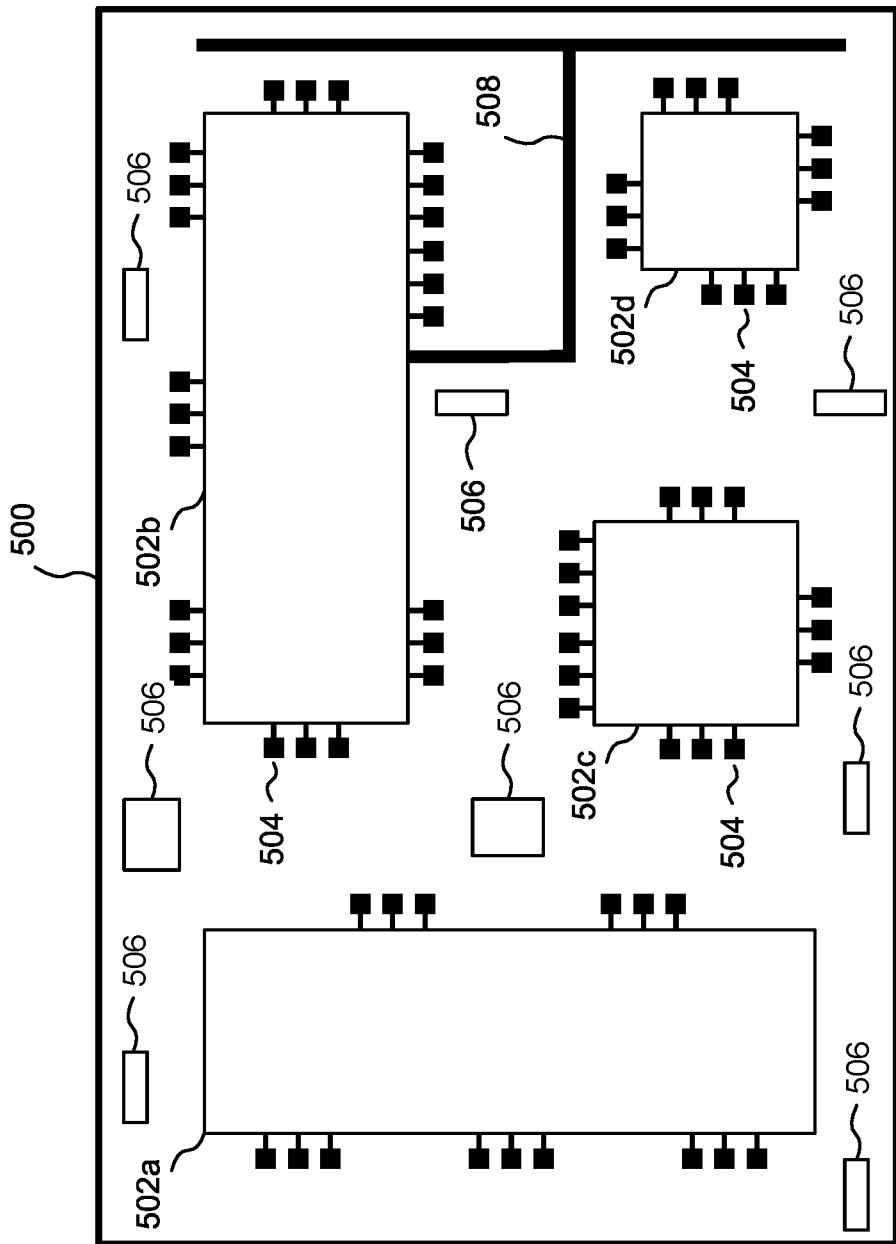
FIG. 5 is a top plan view of a substrate that may be, for example, a printed circuit board or chip module substrate (e.g., a thin-film tile).

As one example of further integration of embodiments of the present invention with other components, FIG. 5 is a top plan view of a substrate 500 that may be, for example, a printed circuit board or chip module substrate (e.g., a thin-film tile). In the illustrated example, the substrate 500 includes multiple ICs 502a-502d having terminal pads 504 which would be interconnected by conductive vias and/or traces on and/or within the substrate 500 or on the opposite (back) surface of the substrate 500 (to avoid clutter, the surface conductive traces are not shown and not all terminal pads are labelled). The ICs 502a-502d may embody, for example, signal switches, active filters, amplifiers (including one or more LNAs), and other circuitry. For example, IC 502b may incorporate one or more instances of a QWS directional coupler with intermediate termination state circuit like the circuits shown in FIGS. 2, 3A, and/or 4A.

The substrate 500 may also include one or more passive devices 506 embedded in, formed on, and/or affixed to the substrate 500. While shown as generic rectangles, the passive devices 506 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 500 to other passive devices 506 and/or the individual ICs 502a-502d.

The front or back surface of the substrate 500 may be used as a location for the formation of other structures. For example, one or more antennae may be formed on or affixed to the front or back surface of the substrate 500; one example of a front-surface antenna 508 is shown, coupled to an IC die 502b, which may include RF front-end circuitry. Thus, by including one or more antennae on the substrate 500, a complete radio may be created System Aspects Embodiments of the present invention are useful in a wide variety of larger radio frequency (RF) circuits and systems for performing a range of functions, including (but not limited to) impedance matching circuits, RF power amplifiers, RF low-noise amplifiers (LNAs), phase shifters, attenuators, antenna beam-steering systems, charge pump devices, RF switches, etc. Such functions are useful in a variety of applications, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, 6G, and WiFi (e.g., 802.11a, b, g, ac, ax, be) protocols, as well as other radio communication standards and protocols.

Figure 6:
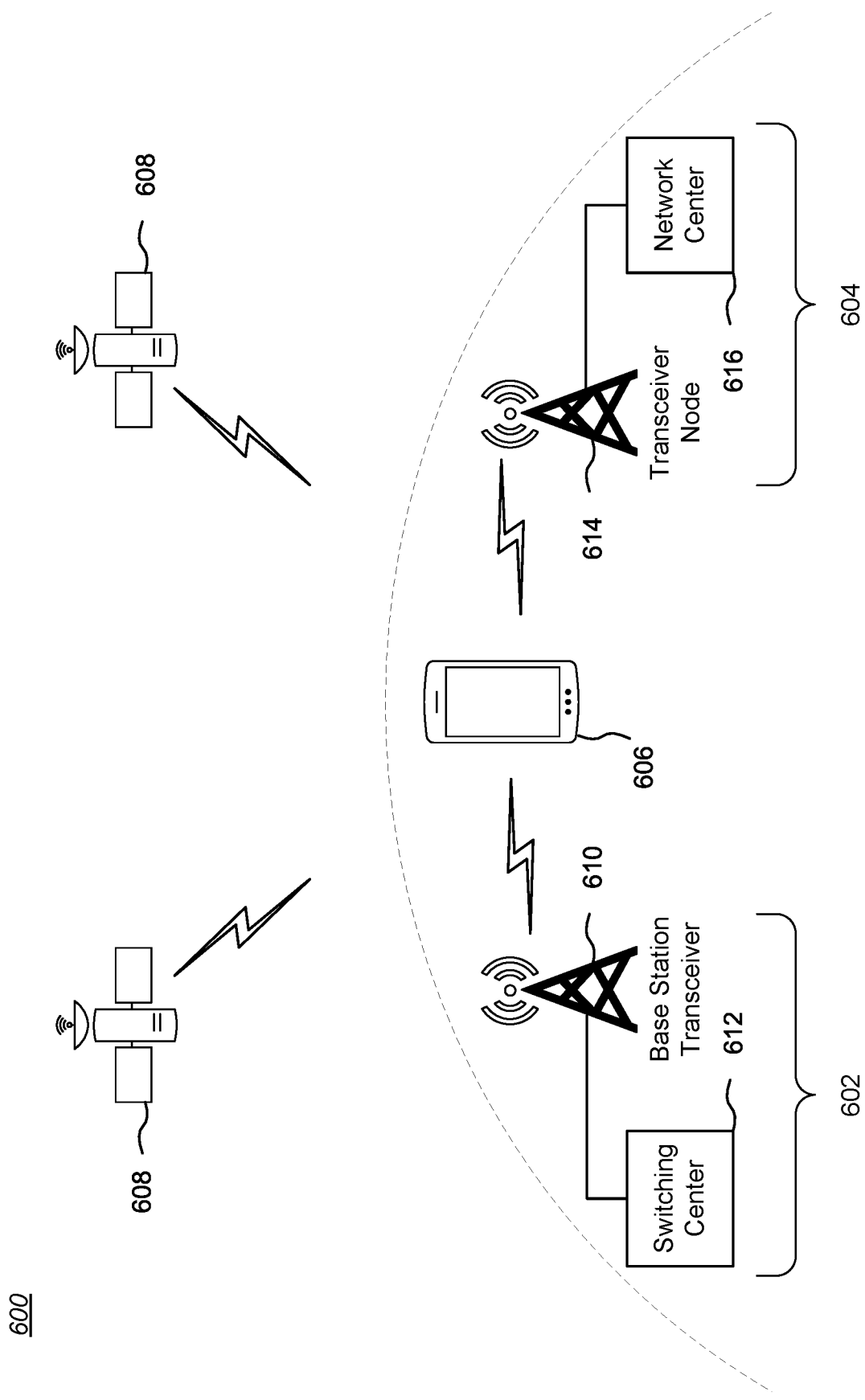
FIG. 6 illustrates an exemplary prior art wireless communication environment comprising different wireless communication systems, and which may include one or more mobile wireless devices.

As an example of wireless RF system usage, FIG. 6 illustrates an exemplary prior art wireless communication environment 600 comprising different wireless communication systems 602 and 604, and which may include one or more mobile wireless devices 606. A wireless device 606 may be a cellular phone, a wireless-enabled computer or tablet, or some other wireless communication unit or device. A wireless device 606 may also be referred to as a mobile station, user equipment, an access terminal, or some other terminology known in the telecommunications industry.

A wireless device 606 may be capable of communicating with multiple wireless communication systems 602, 604 using one or more of telecommunication protocols such as the protocols noted above. A wireless device 606 also may be capable of communicating with one or more satellites 608, such as navigation satellites (e.g., GPS) and/or telecommunication satellites. The wireless device 606 may be equipped with multiple antennas, externally and/or internally, for operation on different frequencies and/or to provide diversity against deleterious path effects such as fading and multi-path interference.

The wireless communication system 602 may be, for example, a CDMA-based system that includes one or more base station transceivers (BSTs) 610 and at least one switching center (SC) 612. Each BST 610 provides over-the-air RF communication for wireless devices 606 within its coverage area. The SC 612 couples to one or more BSTs 610 in the wireless system 602 and provides coordination and control for those BSTs 610.

The wireless communication system 604 may be, for example, a TDMA-based system that includes one or more transceiver nodes 614 and a network center (NC) 616. Each transceiver node 614 provides over-the-air RF communication for wireless devices 606 within its coverage area. The NC 616 couples to one or more transceiver nodes 614 in the wireless system 604 and provides coordination and control for those transceiver nodes 614.

In general, each BST 610 and transceiver node 614 is a fixed station that provides communication coverage for wireless devices 606, and may also be referred to as base stations or some other terminology known in the telecommunications industry. The SC 612 and the NC 616 are network entities that provide coordination and control for the base stations and may also be referred to by other terminologies known in the telecommunications industry.

Figure 7:
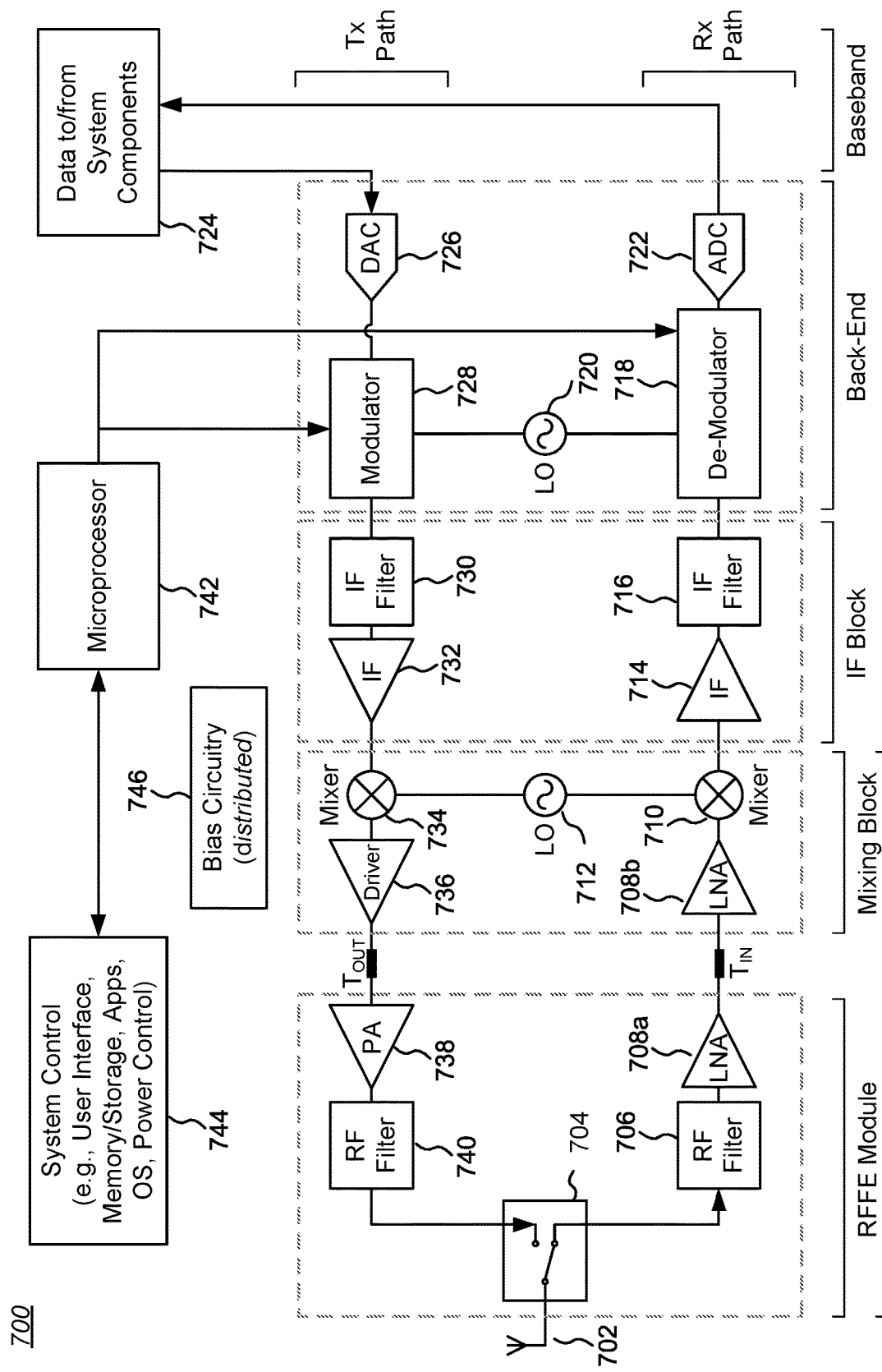
FIG. 7 is a block diagram of a transceiver that might be used in a wireless device, such as a cellular telephone, and which may beneficially incorporate an embodiment of the present invention for improved performance.

An important aspect of any wireless system, including the systems shown in FIG. 6, is in the details of how the component elements of the system perform. FIG. 7 is a block diagram of a transceiver 700 that might be used in a wireless device, such as a cellular telephone, and which may beneficially incorporate an embodiment of the present invention for improved performance. As illustrated, the transceiver 700 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, Intermediate Frequency (IF) Block, Back-End, and Baseband sections (noting that in some implementations, the differentiation between sections may be different). The various illustrated sections and circuit elements may be embodied in one die or multiple IC dies. For example, the RF Front End in the illustrated example may include an RFFE module and a Mixing Block, which may be embodied in (or as part of) different IC dies or modules. The different dies and/or modules may be coupled by transmission lines TIN and TOUT (e.g., microstrips, co-planar waveguides, or an equivalent structure or circuit), either or both of which may have, for example, a 500Ω impedance.

The receiver path Rx receives over-the-air RF signals through at least one antenna 702 and a switching unit 704, which may be implemented with active switching devices (e.g., field effect transistors or FETs) and/or with passive devices that implement frequency-domain multiplexing, such as a diplexer or duplexer. The switching unit may, for example, include one or more instances of a QWS directional coupler with intermediate termination state circuit like the circuits shown in FIGS. 2, 3A, and/or 4A.

An RF filter 706 passes desired received RF signals to at least one low noise amplifier (LNA) 708a, the output of which is coupled from the RFFE Module to at least one LNA 708b in the Mixing Block (through transmission line Tix in this example). The LNA(s) 708b may provide buffering, input matching, and reverse isolation. The output of the LNA(s) 708b is combined in a corresponding mixer 710 with the output of a first local oscillator 712 to produce an IF signal. The IF signal may be amplified by an IF amplifier 714 and subjected to an IF filter 716 before being applied to a demodulator 718, which may be coupled to a second local oscillator 720. The demodulated output of the demodulator 718 is transformed to a digital signal by an analog-to-digital converter 722 and provided to one or more system components 724 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 724 is transformed to an analog signal by a digital-to-analog converter 726, the output of which is applied to a modulator 728, which also may be coupled to the second local oscillator 720. The modulated output of the modulator 728 may be subjected to an IF filter 730 before being amplified by an IF amplifier 732. The output of the IF amplifier 732 is then combined in a mixer 734 with the output of the first local oscillator 712 to produce an RF signal. The RF signal may be amplified by a driver 736, the output of which is coupled to a power amplifier (PA) 738 (through transmission line Tour in this example). The amplified RF signal may be coupled to an RF filter 740, the output of which is coupled to at least one antenna 702 through the switching unit 704.

The operation of the transceiver 700 is controlled by a microprocessor 742 in known fashion, which interacts with system control components 744 (e.g., user interfaces, memory/storage devices, application programs, operating system software, power control, etc.). In addition, the transceiver 700 will generally include other circuitry, such as bias circuitry 746 (which may be distributed throughout the transceiver 700 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 700 may be positioned in a different order (e.g., filters) or omitted. Other components can be (and often are) added, such as (by way of example only) additional filters, impedance matching networks, variable phase shifters/attenuators, power dividers, etc.

As discussed above, the current invention improves QWS directional coupler performance by use intermediate terminated states to prevent ports P3 and P4 from generating large reflection coefficients that cause spur generation. As a person of ordinary skill in the art will understand, a system architecture is beneficially impacted by the current invention in critical ways, including better range, better reception, lower power, longer battery life, and wider bandwidth due to the mitigation or elimination of reflection-related spurs. These system-level improvements are specifically enabled by the current invention since a number of RF standards and commercial requirements specify high performance, low levels of self-induced noise, low power, and wide bandwidth. In order to comply with system standards or customer requirements, the current invention is therefore critical to the overall solution shown in FIG. 7. The current invention therefore specifically defines a system-level embodiment that is creatively enabled by its inclusion in that system.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar junction transistors (BJTs), BICMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the stages described above may be order independent, and thus can be performed in an order different from that described. Further, some of the stages described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A quarter-wavelength switchable directional coupler having a forward mode of operation and a reverse mode of operation, the quarter-wavelength switchable directional coupler including:
   (a) a primary transmission line having a first port and a second port;
   (b) a secondary transmission line having a third port and a fourth port;
   (c) a first independent termination circuit selectively couplable to the third port; and
   (d) a second independent termination circuit selectively couplable to the fourth port;
      wherein during transitions of the quarter-wavelength switchable directional coupler between the forward mode of operation and the reverse mode of operation, the third port and the fourth port are concurrently terminated by at least one of the first independent termination circuit or the second independent termination circuit.

2. The quarter-wavelength switchable directional coupler of claim 1, wherein the first and second independent termination circuits each include a switch coupled in series with a resistor.

3. The quarter-wavelength switchable directional coupler of claim 1, further including a first capacitor coupled to the third port, and a second capacitor coupled to the fourth port.

4. The quarter-wavelength switchable directional coupler of claim 1, further including a switch coupled between the third port and the fourth port, wherein at a point in time during transitions of the quarter-wavelength switchable directional coupler between the forward mode of operation and the reverse mode of operation, the switch is closed to couple the third port and the fourth port together.

5. A quarter-wavelength switchable directional coupler having a forward mode of operation and a reverse mode of operation, the quarter-wavelength switchable directional coupler including:
   (a) a primary transmission line having a first port and a second port;
   (b) a secondary transmission line having a third port and a fourth port;
   (c) a first termination circuit selectively couplable to the third port;
   (d) a second termination circuit selectively couplable to the fourth port;
   (e) a first independent termination circuit selectively couplable to the third port; and
   (f) a second independent termination circuit selectively couplable to the fourth port;
      wherein the first termination circuit terminates the third port in the reverse mode of operation, and the second termination circuit terminates the fourth port in the forward mode of operation; and
   wherein during transitions of the quarter-wavelength switchable directional coupler between the forward mode of operation and the reverse mode of operation, the third port and the fourth port are concurrently terminated by at least one of the first independent termination circuit or the second independent termination circuit.

6. The quarter-wavelength switchable directional coupler of claim 5, wherein the first and second independent termination circuits each include a switch coupled in series with a resistor.

7. The quarter-wavelength switchable directional coupler of claim 5, further including a first capacitor coupled to the third port, and a second capacitor coupled to the fourth port.

8. The quarter-wavelength switchable directional coupler of claim 5, further including a switch coupled between the third port and the fourth port, wherein at a point in time during transitions of the quarter-wavelength switchable directional coupler between the forward mode of operation and the reverse mode of operation, the switch is closed to couple the third port and the fourth port together.

9. A quarter-wavelength switchable directional coupler having a forward mode of operation and a reverse mode of operation, the quarter-wavelength switchable directional coupler including:
   (a) a primary transmission line having a first port and a second port;
   (b) a secondary transmission line having a third port and a fourth port;
   (c) a first termination circuit selectively couplable to the third port;
   (d) a second termination circuit selectively couplable to the fourth port;
   (e) a first independent termination circuit having a first impedance and selectively couplable to the third port during transitions of the quarter-wavelength switchable directional coupler between the forward mode of operation and the reverse mode of operation; and
   (f) a second independent termination circuit having a second impedance and selectively couplable to the fourth port during transitions of the quarter-wavelength switchable directional coupler between the forward mode of operation and the reverse mode of operation;
      wherein during transitions of the quarter-wavelength switchable directional coupler from the forward mode of operation to the reverse mode of operation, or from the reverse mode of operation to the forward mode of operation, the third port and the fourth port are concurrently terminated by at least one of the first independent termination circuit or the second independent termination circuit and an impedance of the third port and an impedance of the fourth port are no higher than the greater of the first impedance or the second impedance.

10. The quarter-wavelength switchable directional coupler of claim 9, wherein the first and second independent termination circuits each include a switch coupled in series with a resistor.

11. The quarter-wavelength switchable directional coupler of claim 9, further including a first capacitor coupled to the third port, and a second capacitor coupled to the fourth port.

12. The quarter-wavelength switchable directional coupler of claim 9, further including a switch coupled between the third port and the fourth port, wherein at a point in time during transitions of the quarter-wavelength switchable directional coupler between the forward mode of operation and the reverse mode of operation, the switch is closed to couple the third port and the fourth port together.

* * * * *